(12) United States Patent
Kwon

(10) Patent No.: US 8,754,878 B2
(45) Date of Patent: Jun. 17, 2014

(54) DISPLAY SUBSTRATE, METHOD OF MANUFACTURING THE DISPLAY SUBSTRATE AND DISPLAY DEVICE HAVING THE DISPLAY SUBSTRATE

(75) Inventor: Yeong-Keun Kwon, Suwon-si (KR)

(73) Assignee: Samsung Display Co., Ltd. (KR)

( * ) Notice: Subject to any disclaimer, the term of this patent is extended or adjusted under 35 U.S.C. 154(b) by 926 days.

(21) Appl. No.: 12/897,529

(22) Filed: Oct. 4, 2010

(65) Prior Publication Data

US 2011/0187685 A1 Aug. 4, 2011

(30) Foreign Application Priority Data

Feb. 1, 2010 (KR) .................. 10-2010-0009094

(51) Int. Cl.
*G06F 3/038* (2013.01)
*G06F 3/041* (2006.01)

(52) U.S. Cl.
USPC .......................................... 345/206; 345/173

(58) Field of Classification Search
USPC .......................... 345/173, 178, 206
See application file for complete search history.

(56) References Cited

U.S. PATENT DOCUMENTS

| 7,221,352 | B2 | 5/2007 | Kodate et al. | |
| 2004/0263760 | A1* | 12/2004 | Kodate et al. | 349/151 |

FOREIGN PATENT DOCUMENTS

| JP | 05-265045 A | 10/1993 |
| JP | 06-027488 A | 2/1994 |
| JP | 2006-350289 A | 12/2006 |
| KR | 1020060081833 A | 7/2006 |
| KR | 1020070093614 A | 9/2007 |
| KR | 1020070109011 A | 11/2007 |
| KR | 1020070120269 A | 12/2007 |
| KR | 1020080002278 A | 1/2008 |
| KR | 1020080059864 A | 7/2008 |
| KR | 1020080064339 A | 7/2008 |

* cited by examiner

*Primary Examiner* — Michael Faragalla
(74) *Attorney, Agent, or Firm* — Cantor Colburn LLP

(57) ABSTRACT

A display substrate includes a first storage line, a second storage line, a first data line, a second data line, a storage electrode, a first sub-storage electrode and a second sub-storage electrode. The first storage line is extended in a first direction. The second storage line is spaced apart from and parallel to the first storage line. The first data line is extended in a second direction. The second data line is spaced apart from and parallel to the first data line. The storage electrode is connected to the first and second storage lines, and extended in the second direction. The storage electrode is disposed on an interval area between the first and second data lines. The first sub-storage electrode is overlapped with a first area of the storage electrode. The second sub-storage electrode is overlapped with a second area of the storage electrode.

19 Claims, 13 Drawing Sheets

DISPLAY SUBSTRATE, METHOD OF MANUFACTURING THE DISPLAY SUBSTRATE AND DISPLAY DEVICE HAVING THE DISPLAY SUBSTRATE

This application claims priority to Korean Patent Application No. 2010-0009094, filed on Feb. 1, 2010, and all the benefits accruing therefrom under 35 U.S.C. §119, the contents of which are herein incorporated by reference in their entirety.

BACKGROUND OF THE INVENTION

1. Field of the Invention

Exemplary embodiments of the invention relate to a display substrate, a method of manufacturing the display substrate and a display device having the display substrate. More particularly, exemplary embodiments of the invention relate to a display substrate capable of enhancing display quality, a method of manufacturing the display substrate, and a display device having the display substrate.

2. Description of the Related Art

Conventionally, a liquid crystal display ("LCD") device includes an LCD panel, and a driving device which drives the LCD panel. The LCD panel includes a plurality of a data line, and a plurality of a gate line crossing the data lines. The data line and the gate line are connected to a pixel part. The driving part includes a gate driving circuit which outputs a gate signal to the gate lines, and a data driving circuit which outputs a data signal to the data lines.

As use of the LCD device is generalized, efforts for reducing the number of data driving circuits are made to decrease a total size and cost of the LCD device. One of the efforts is that a data line half-reduction structure is applied in the LCD device. The data line half-reduction structure includes a first pixel and a second pixel that are formed on one area that is divided by data lines adjacent to each other and gate lines adjacent to each other. Charging timings of the first and second pixels are different to each other. In the data line half-reduction structure of the LCD device, the number of data lines is reduced into a half in comparison with a convention LCD device. However, the number of gate lines is increased twice in comparison with a convention LCD device. A plurality of pixels arranged in the same pixel column is driven by two gate lines disposed in an upper portion and a lower portion.

Thus, in the data line half-reduction structure of the LCD device, the number of data lines and the number of data driving circuit are decreased into a half in comparison with a convention LCD device, so that manufacturing costs thereof may be reduced. However, an aperture ratio thereof may be decreased.

BRIEF SUMMARY OF THE INVENTION

Exemplary embodiments of the invention provide a display substrate having an increased aperture ratio.

Exemplary embodiments of the invention also provide a method of manufacturing the above-mentioned display substrate.

Exemplary embodiments of the invention further also provide a display device having the above-mentioned display substrate.

According to an exemplary embodiment of the invention, a display substrate includes a first storage line, a second storage line, a first data line, a second data line, a storage electrode, a first sub-storage electrode and a second sub-storage electrode. The first storage line is extended in a first direction on a base substrate. The second storage line is spaced apart from the first storage line and extended substantially in parallel with the first storage line. The first data line is extended in a second direction crossing the first direction. The second data line is spaced apart from the first data line and extended substantially in parallel with the first data line. The storage electrode is connected to the first and second storage lines, and extended in the second direction. The storage electrode is disposed on an interval area between the first and second data lines. The first sub-storage electrode is overlapped with a first area of the storage electrode. The second sub-storage electrode is overlapped with a second area of the storage electrode.

According to another exemplary embodiment of the invention, there is provided a method of manufacturing a display substrate. In the method, a first storage line extended in a first direction, a second storage line spaced apart from the first storage line and extended substantially in parallel with the first storage line, and a storage electrode connected to the first and second storage lines and extended in a second direction crossing the first direction, are formed on a base substrate. A first data line extended in the second direction, a second data line spaced apart from the first data line, a first sub-storage electrode overlapped with a first area of the storage electrode, and a second sub-storage electrode overlapped with a second area of the storage electrode, are formed. A first pixel electrode electrically connected to the first sub-storage electrode, and a second pixel electrode electrically connected to the second sub-storage electrode, are formed on an interval area between the first and second data lines.

According to another exemplary embodiment of the invention, a display device includes a display panel and a panel driving part. The display panel includes a first storage line, a second storage line, a first data line, a second data line, a storage electrode, a first sub-storage electrode and a second sub-storage electrode. The first storage line is extended in a first direction on a base substrate. The second storage line is spaced apart from the first storage line and extended substantially in parallel with the first storage line. The first data line is extended in a second direction crossing the first direction. The second data line is spaced apart from the first data line and extended substantially in parallel with the first data line. The storage electrode is connected to the first and second storage lines, and extended in the second direction. The storage electrode is disposed on an interval area between the first and second data lines. The first sub-storage electrode is overlapped with a first area of the storage electrode. The second sub-storage electrode is overlapped with a second area of the storage electrode. The panel driving part applies data signals having polarities different from each other to the first data line and the second data line, during one frame.

According to the display substrate, the method of manufacturing the display substrate, and the display device having the display substrate, of the invention, an aperture ratio is enhanced and a storage capacitance is increased, so that display quality of the display device may be enhanced.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
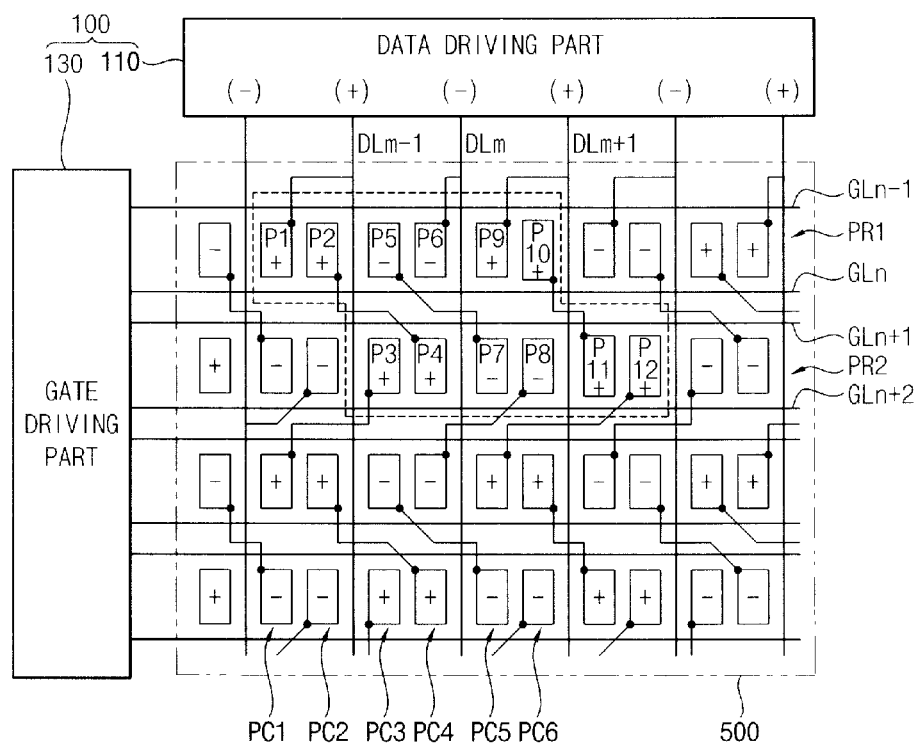
FIG. 1 is a block diagram schematically illustrating an exemplary embodiment of a display device according to an the invention.

The invention is described more fully hereinafter with reference to the accompanying drawings, in which exemplary embodiments of the invention are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. As used herein, "connected" may refer to elements being physically and/or electrically connected to each other.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a block diagram schematically illustrating an exemplary embodiment of a display device, according to the invention.

Referring to FIG. 1, the display device includes a panel driving part 100 and a display panel 500.

The panel driving part 100 includes a data driving part 110 and a gate driving part 130.

The data driving part 110 respectively applies data signals to a plurality of a data line (DLm−1, DLm and DLm+1) disposed on the display panel 500. In one exemplary embodiment, for example, during an N-th frame, the data driving part 110 applies a data signal of a negative polarity (−) to an m-th data line DLm, and applies a first data signal of a positive polarity (+) to an (m−1)-th data line DLm−1 and an (m+1)-th data line DLm+1 adjacent to the m-th data line DLm, respectively. Then, during an (N+1)-th frame, the data driving part 110 applies respective data signals having a polarity opposite to that of a data signal applied during the N-th frame. Thus, the data driving part 110 may drive the display panel 500 in a column inversion driving method. In this case, 'm' and 'N' are natural numbers.

The gate driving part 130 sequentially applies gate signals to a plurality of a gate line (GLn−1, GLn, GLn+1 and GLn+2) disposed on the display panel 500. In this case, 'n' is a natural number. In one exemplary embodiment, for example, the gate driving part 130 sequentially applies gate signals to multiple (e.g., two) gate lines, that are, an (n−1)-th gate line GLn−1 and an n-th gate line GLn during a horizontal period (1H).

The display panel 500 includes the gate lines GLn−1, GLn, GLn+1 and GLn+2 longitudinally extending in a first direction D1, the data lines DLm−1, DLm and DLm+1 longitudinally extending in a second direction D2 crossing the first direction D1, and a plurality of a pixel (P1, P2, P3, . . . , P12).

The pixels P1, P2, P3, . . . , P12 are arranged in a plurality of a pixel row (PR1 and PR2), and a plurality of a pixel column (PC1, PC2, PC3, PC4, PC5 and PC6). The first direction D1 corresponds to a row direction, and the second direction D2 corresponds to a column direction D2. Each of the pixels P1, P2, P3, . . . , P12 includes a liquid crystal capacitor defined by a pixel electrode, a liquid crystal layer and a common electrode, and a storage capacitor maintaining a charge voltage charged in the liquid crystal capacitor during one frame.

Each of the data lines DLm−1, DLm and DLm+1 is electrically connected to two pixels that are adjacent to each other and are arranged in the same row. A pair of gate lines GLn−1 and GLn, or a pair of gate lines GLn+1 and GLn+2 is electrically connected to pixels arranged in the same row.

Referring to FIG. 1, for example, an (m−1)-th data line DLm−1 is electrically connected to a first pixel P1 and a second pixel P2 of a first pixel row PR1, and is electrically connected to a third pixel P3 and a fourth pixel P4 of a second pixel row PR2. An (n−1)-th gate line GLn−1 is electrically connected to the first pixel P1 of the first pixel row PR1, and an n-th gate line GLn is electrically connected to the second pixel P2 of the first pixel row PR1. An (n+1)-th gate line GLn+1 is electrically connected to the fourth pixel P4 of the second pixel row PR2, and an (n+2)-th gate line GLn+2 is electrically connected to the third pixel P3 of the second pixel row PR2.

An m-th data line DLm is electrically connected to a fifth pixel P5 and a sixth pixel P6 of a first pixel row PR1, and is electrically connected to a seventh pixel P7 and an eighth pixel P8 of a second pixel row PR2. An (n−1)-th gate line GLn−1 is electrically connected to the sixth pixel P6 of the first pixel row PR1, and an n-th gate line GLn is electrically connected to the fifth pixel P5 of the first pixel PR1. An (n+1)-th gate line GLn+1 is electrically connected to the seventh pixel P7 of the second pixel row PR2, and an (n+2)-th gate line GLn+2 is electrically connected to the eighth pixel P8 of the second pixel row PR2.

An (m+1)-th data line DLm+1 is electrically connected to a ninth pixel P9 and a tenth pixel P10 of the first pixel row PR1, and is electrically connected to an eleventh pixel P11 and a twelfth pixel P12 of the second pixel row PR2. An (n−1)-th gate line GLn−1 is electrically connected to the ninth pixel P9 of the first pixel row PR1, and an n-th gate line GLn is electrically connected to the tenth pixel P10 of the first pixel row PR1. An (n+1)-th gate line GLn+1 is electrically connected to the eleventh pixel P11 of the second pixel row PR2, and an (n+2)-th gate line GLn+2 is electrically connected to the twelfth pixel P12 of the second pixel row PR2.

The display panel 500 includes a structure in which the first to twelfth pixels P1, P2, . . . , P12 are repeated. A pixel group of the twelve pixels P1, P2, . . . , P12 is indicated by a dotted line in FIG. 1 surrounding the twelve pixels P1, P2, . . . , P12 in FIG. 1. The display panel 500 is driven in a 2×1 dot inversion method, in accordance with a column inversion driving of the data driving part 110.

Figure 2:
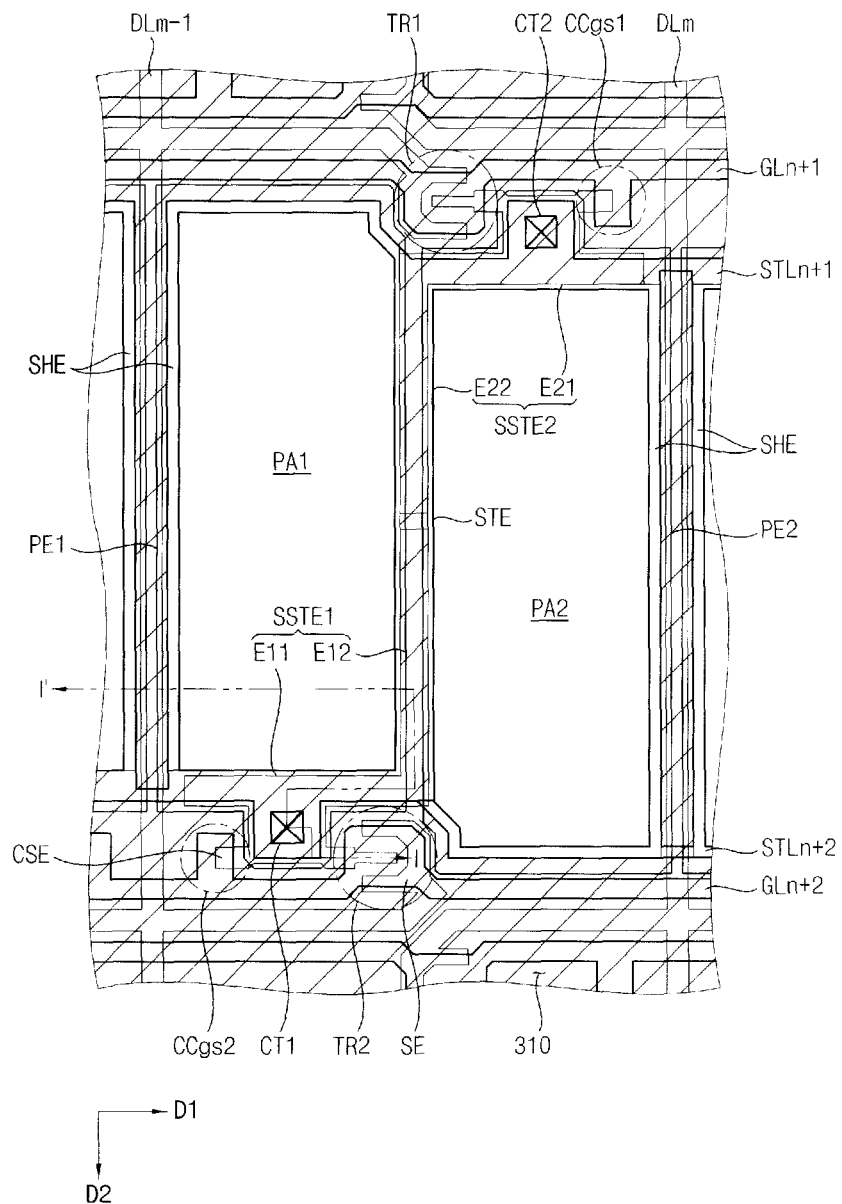
FIG. 2 is a plan view schematically illustrating an exemplary embodiment of a portion of the display panel of FIG. 1.
Figure 3:
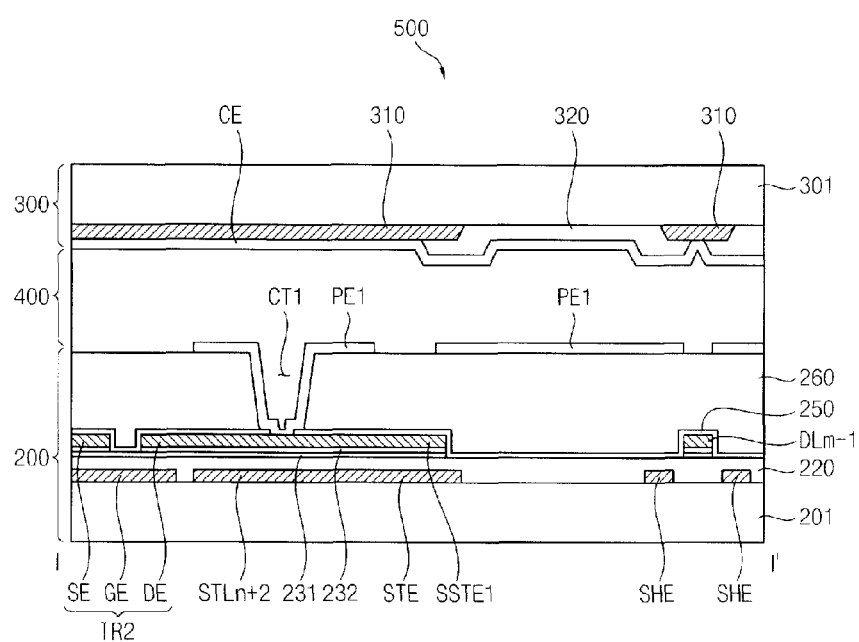
FIG. 3 is a cross-sectional view taken along line I-I' of FIG. 2.

FIG. 2 is a plan view schematically illustrating an exemplary embodiment of a portion of the display panel of FIG. 1. FIG. 3 is a cross-sectional view taken along line I-I' of FIG. 2.

Referring to FIGS. 2 and 3, the display panel 500 includes a display substrate 200, an opposite substrate 300 and a liquid crystal layer 400.

The display substrate 200 includes a first base substrate 201, a first conductive pattern, a gate insulation layer 220, a second conductive pattern, a protection insulation layer 250, an organic layer 260 and a third conductive pattern.

The first base substrate 201 may be a transparent glass substrate.

Figure 4A:
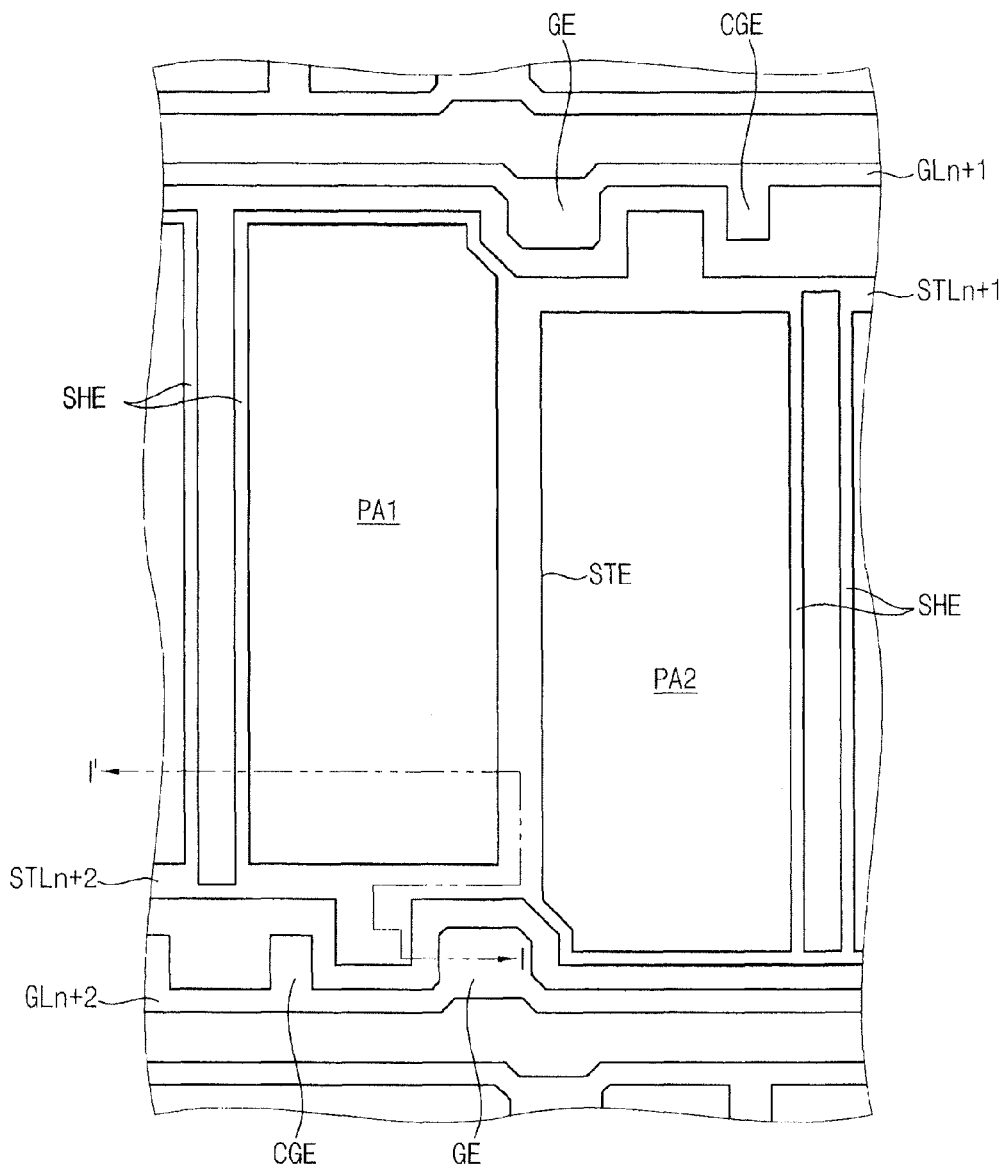
FIG. 4A is a plan view schematically showing an exemplary embodiment of a method of manufacturing a first conductive pattern of FIG. 3.

The first conductive pattern is disposed directly on the first base substrate 201. The first conductive pattern is collectively defined by a first conductive layer and includes an (n+1)-th gate line GLn+1, an (n+2)-th gate line GLn+2, an (n+1)-th storage line STLn+1, an (n+2)-th storage line STLn+2, a storage electrode STE, a light-shielding electrode SHE, a gate electrode GE and a compensation gate electrode CGE (FIG. 4A).

The (n+1)-th gate line GLn+1 and the (n+2)-th gate line GLn+2 are longitudinally extended in the first direction D1, and are arranged in the second direction D2. The (n+1)-th storage line STLn+1 and the (n+2)-th storage line STLn+2 are longitudinally extended in first direction D1 to be disposed at an interval area of (e.g., between) the (n+1)-th gate line GLn+1 and the (n+2)-th gate line GLn+2, and are disposed to adjacent to the (n+1)-th gate line GLn+1 and the (n+2)-th gate line GLn+2.

The storage electrode STE is longitudinally extended in the second direction D2 to physically and electrically connect the (n+1)-th storage line STLn+1 and the (n+2)-th storage line STLn+2 to each other. The storage electrode STE divides a first pixel area PA1, and a second pixel area PA2 adjacent to the first pixel area PA1 in the first direction D1. The storage electrode STE is a first electrode of a storage capacitor. The storage electrode STE may block light leakage between a first pixel PE1 and a second pixel PE2.

The light-shielding electrode SHE is longitudinally extended in the second direction D2 to physically and electrically connect the (n+1)-th storage line STLn+1 and the (n+2)-th storage line STLn+2 to each other. The light-shielding electrode SHE is disposed adjacent to an end (e.g., edge) portion of the (m−1)-th data line DLm−1 or an end (e.g., edge) portion of the m-th data line DLm, to block light leakage generated at an area adjacent to the (m−1)-th data line DLm−1 or the m-th data line DLm, in the plan view. The storage electrode STE, the (n+1)-th storage line STLn+1, the (n+2)-th storage line STLn+2 and the light-shielding electrode SHE collectively form a single unitary and continuous member.

In an exemplary embodiment, the light-shielding electrode SHE may be used as a first electrode of a storage capacitor. When the light-shielding electrode SHE is the first electrode of the storage capacitor, each of the first and second pixel electrodes PE1 and PE2 may be a second electrode of the storage capacitor. Moreover, when a light-shielding part 310 has a sufficient width at the opposite substrate 300, the light-shielding electrode SHE may be omitted.

The gate electrode GE and the compensation gate electrode CGE are respectively connected to the (n+1)-th gate line GLn+1 or the (n+2)-th gate line GLn+2. Referring to FIG. 2, the gate electrode GE and the compensation gate electrode CGE that are connected to the (n+1)-th gate line GLn+1 are included in a first transistor TR1 and a first compensation capacitor CCgs1, and the gate electrode GE and the compensation gate electrode CGE that are connected to the (n+2)-th gate line GLn+2 are included in a second transistor TR2 and a second compensation capacitor CCgs2.

The gate insulation layer 220 is disposed on the first base substrate 201, on which the first conductive pattern is disposed to cover the first conductive pattern. The gate insulation layer 220 overlaps the first conductive pattern which is disposed between the gate insulation layer 220 and the first base substrate 201.

The second conductive pattern is disposed on the gate insulation layer 220, such that the gate insulation layer 220 is disposed between the second conductive pattern and the first conductive pattern. The second conductive pattern is collectively defined by a second conductive layer. The second conductive pattern includes an (m−1)-th data line DLm−1, an m-th data line DLm, a first sub-storage electrode SSTE1, a second sub-storage electrode SSTE2, a source electrode SE, a drain electrode DE and a compensation electrode CSE.

The (m−1)-th data line DLm−1 and the m-th data line DLm are longitudinally extended in the second direction D2 to be arranged in the first direction D1. Each of end (e.g., edge) portions of the (m−1)-th data line DLm−1 and the m-th data line DLm is disposed adjacent to the light-shielding electrode SHE, in the plan view. The (m−1)-th data line DLm−1 is electrically connected to the first transistor TR1, and is electrically connected to the second transistor TR2. The first pixel area PA1 and the second pixel area PA2 are disposed overlapping the (m−1)-th data line DLm−1 and the m-th data line DLm, as divided by the storage electrode STE.

Referring to FIG. 2, the first sub-storage electrode SSTE1 includes a first electrode E11 overlapping with the (n+2)-th storage line STLn+2 disposed on the first pixel area PA1, and a second electrode E12 connected to the first electrode E11 to be overlapped with a first area of the storage electrode STE. The second sub-storage electrode SSTE2 includes a first electrode E21 overlapped with the (n+1)-th storage line STLn+1 disposed on the second pixel area PA2, and a second electrode E22 connected to the first electrode E21 to be overlapped with a second area of the storage electrode STE. The storage electrode STE is disposed on a middle portion between the (m−1)-th data line DLm−1 and the m-th data line DLm, and is overlapped with the first sub-storage electrode SSTE1 and the second sub-storage electrode SSTE2 in a substantially uniform overlapping length. Each of the first and second sub-storage electrodes SSTE1 and SSTE2 is a second electrode of the storage capacitor.

The source electrode SE is connected to the (m−1)-th data line DLm−1 or the m-th data line DLm. The source electrode SE and the compensation source electrode CSE are connected to the first sub-storage electrode SSTE1 or the second sub-storage electrode SSTE2.

The second transistor TR2 includes the drain electrode DE connected to the first sub-storage electrode SSTE1, and a source electrode SE spaced apart from the drain electrode DE to be connected to the (m−1)-th data line DLm−1. The second compensation capacitor CCgs2 includes a compensation source electrode CSE connected to the first sub-storage electrode SSTE1. When an alignment between the first conductive pattern and the second conductive pattern is mismatched, the second compensation capacitor CCgs2 may compensate a parasitic capacitance Cgs between a gate electrode GE and a source electrode SE of the second transistor TR2.

The first transistor TR1 includes the drain electrode DE connected to the second sub-storage electrode SSTE2 and a source electrode SE spaced apart from the drain electrode DE to be connected to the (m−1)-th data line DLm−1, and the first compensation capacitor CCgs1 includes a compensation source electrode CSE connected to the second sub-storage electrode SSTE2. When an alignment between the first conductive pattern and the second conductive pattern is mismatched, the first compensation capacitor CCgs1 may compensate a parasitic capacitance Cgs between a gate electrode GE and a source electrode SE of the first transistor TR1.

The protection insulation layer 250 is disposed on the first base substrate 201 on which the second conductive pattern is disposed, to cover the second conductive pattern.

The organic layer 260 is disposed on the protection layer 250. A thickness of the organic layer 260 may be about 2.5 micrometers (μm) to about 3 micrometers (μm).

The third conductive pattern is disposed on the organic layer 260 to contact with the organic layer 260. The third conductive pattern may be collectively defined by a third conductive layer which includes an optically transparent conductive material. The third conductive pattern includes the first pixel electrode PE1 and the second pixel electrode PE2. The first pixel electrode PE1 is disposed on the first pixel area PA1, and the second pixel electrode PE2 is disposed on the second pixel area PA2. Referring to FIG. 2, each of end (e.g., edge) portions of the first and second pixel electrodes PE1 and PE2 is respectively disposed on the first and second pixel areas PA1 and PA2, to partially overlap with the (n+1)-th storage line STLn+1, the storage electrode STE, the light-shielding electrode SHE and the (n+2)-th storage line STLn+2.

The first pixel electrode PE1 is electrically connected to the first electrode E11 of the first sub-storage electrode SSTE1 through a first contact portion CT1. The second pixel electrode PE2 is electrically connected to the first electrode E21 of the second sub-storage electrode SSTE2 through a second contact portion CT2.

As a result, a first pixel voltage applied to the first pixel electrode PE1 is applied to the first sub-storage electrode SSTE1. Thus, a storage pattern disposed on the first pixel area PA1 may be collectively formed by the first sub-storage electrode SSTE1, the gate insulation layer 220, the protection insulation layer 250, the (n+2)-th storage line STLn+2 overlapped with the first sub-storage electrode SSTE1, and the first area of the storage electrode STE.

A second pixel voltage applied to the second pixel electrode PE2 is applied to the second sub-storage electrode SSTE2. Thus, a storage capacitor included in the second pixel P2 may be collectively formed by the second sub-storage electrode SSTE2, the gate insulation layer 220, the protection insulation layer 250, the (n+1)-th storage line STLn+1 overlapped with the second sub-storage electrode SSTE2, and the second area of the storage electrode STE.

As a result, the storage electrode STE and the sub-storage electrode SSTE1 and SSTE2, which overlaps with the storage electrode STE to be electrically connected to the pixel electrode PE1 and PE2, are disposed in an area where the data line is not disposed, so that an aperture ratio is not decreased and sufficient storage capacitance may be secured. Moreover, light leakage, which is generated at an interval area between pixel electrodes PE1 and PE2 adjacent to the storage electrode STE, may be prevented.

Referring again to FIG. 3, the opposite substrate 300 includes a second base substrate 301, the light-shielding part 310, a color filter 320 and a common electrode CE.

The second base substrate 301 may include an optically transparent glass substrate.

The light-shielding part 310 is disposed on the second base substrate 301 in correspondence with a light-shielding area. The light-shielding area corresponds to an area where the first and second pixel electrodes PE1 and PE2 are not disposed. The light-shielding part 310 may have a matrix shape in a plan view of the display device. A width of the light-shielding part 310 overlapping the (m−1)-th data line DLm−1 may be decreased due to the light-shielding electrode SHE disposed adjacent to the (m−1)-th data line DLm−1, and thus a high aperture ratio may be realized.

The color filter 320 is disposed on a transmittance area of the second base substrate 301. The transmittance area corresponds to an area on which the first and second pixel electrodes PE1 and PE2 are disposed, for example, excluding the light-shielding area. The color filter 320 may include a red filter (R), a green filter (G) and a blue filter (B).

The common electrode CE is disposed on the second base substrate 301, on which the color filter 320 is disposed. The common electrode CE faces the first and second pixel electrodes PE1 and PE2.

The liquid crystal layer 400 is disposed between the display substrate 200 and the opposite substrate 300. Each of pixels of the display panel 500 includes a liquid crystal capacitor defined by the first and second pixel electrodes PE1 and PE2, the common electrode CE and the liquid crystal layer 400.

According to the illustrated embodiment, a storage electrode is disposed on an area which a data line is not disposed, to collectively form a storage capacitor of a pixel. Moreover, in a high aperture ratio structure in which a formation area of a pixel electrode is expanded by employing the organic layer, a storage capacitor is formed by using a storage electrode disposed on an area which the data line is not formed and a sub-storage electrode overlapped with the storage electrode, so that a storage capacitance may be obtained in correspondence with an increase of liquid crystal capacitance.

Figure 4B:
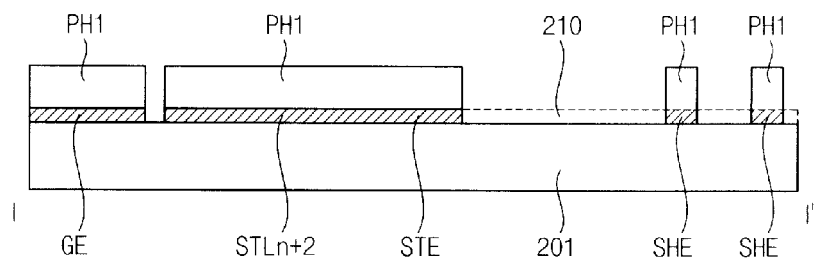
FIG. 4B is a cross-sectional view schematically showing the method of manufacturing the first conductive pattern of FIG. 3.

FIG. 4A is a plan view schematically showing an exemplary embodiment of a method of manufacturing a first conductive pattern of FIG. 3, and FIG. 4B is a cross-sectional view schematically showing the method of manufacturing a first conductive pattern of FIG. 3.

Referring to FIGS. 4A and 4B, a first conductive layer 210 is formed on the first base substrate 201. The first conductive layer may be formed in a single layer or multiple layers. The first conductive layer may include a metal material.

The first conductive layer is patterned by using a first photoresist pattern PH1 to form a first conductive pattern. The first conductive pattern includes an (n+1)-th gate line GLn+1, an (n+2)-th gate line GLn+2, an (n+1)-th storage line STLn+1, an (n+2)-th storage line STLn+2, a storage electrode STE, a light-shielding electrode SHE, a gate electrode GE and a compensation gate electrode CGE.

The (n+1)-th gate line GLn+1 and the (n+2)-th gate line GLn+2 are longitudinally extended in the first direction D1, and are arranged in the second direction D2.

The (n+1)-th storage line STLn+1 and the (n+2)-th storage line STLn+2 are longitudinally extended in the first direction D1, and are arranged in the second direction D2. Each of the (n+1)-th and (n+2)-th storage lines STLn+1 and STLn+2 is disposed adjacent to the n-th gate line GLn and the (n+1)-th gate line GLn+1 and between the n-th gate line GLn and the (n+1)-th gate line GLn+1.

The storage electrode STE is longitudinally extended in the second direction D2 to connect to the (n+1)-th storage line STLn+1 and the (n+2)-th storage line STLn+2. The storage electrode STE is disposed between a first pixel PA1, and the second pixel area PA2 adjacent to the first pixel area PA1 in the first direction D1.

The light-shielding electrode SHE is longitudinally extended in the second direction D2 to connect the (n+1)-th storage line STLn+1 and the (n+2)-th storage line STLn+2. The storage electrode STE, the (n+1)-th storage line STLn+1, the (n+2)-th storage line STLn+2 and the light-shielding electrode SHE collectively form a single unitary and continuous member, as illustrated in FIG. 4A. The light-shielding electrode SHE is not overlapped with the (m−1)-th data line DLm−1. The light-shielding electrode SHE is spaced apart from two end (e.g., edge) portions of the (m−1)-th data line DLm−1 which are substantially in parallel with each other in a plan view.

A storage common voltage Vst is applied to the (n+1)-th storage line STLn+1 and the (n+2)-th storage line STLn+2, and is also applied to the storage electrode STE connected to the (n+1)-th and (n+2)-th storage lines STLn+1 and STLn+2 and the light-shielding electrode SHE.

The light-shielding electrode SHE is disposed adjacent to an end (e.g., edge) portion of the (m−1)-th data line DLm−1, or an end (e.g., edge) portion of the m-th data line DLm, to shield light leakage at an area directly adjacent to the (m−1)-th data line DLm−1 or the m-th data line DLm.

In the illustrated embodiment, the light-shielding electrode SHE is physically and electrically connected to the (n+1)-th storage line STLn+1 and the (n+2)-th storage line STLn+2 to receive the storage common voltage Vst. Alternatively, the light-shielding electrode SHE may be formed in a floating structure in which the (n+1)-th storage line STLn+1 and the (n+2)-th storage line STLn+2 are not physically and/or electrically connected to each other. Moreover, the light-shielding electrode SHE may be omitted.

The gate electrode GE and the compensation gate electrode CGE are physically and electrically connected to the (n+1)-th gate line GLn+1 or the (n+2)-th gate line GLn+2. The gate electrode GE, the compensation gate electrode CGE and the gate line GLn collectively form a single unitary and continuous member, as illustrated in FIG. 4A. Each of the gate electrode GE and the compensation gate electrode CGE physically and electrically connected to the (n+2)-th gate line GLn+2 is protruded toward the first pixel area PA1, in the plan view. Each of the gate electrode GE and the compensation gate electrode CGE connected to the (n+1)-th gate line GLn+1 is protruded toward the second pixel area PA2, in the plan view.

Figure 5A:
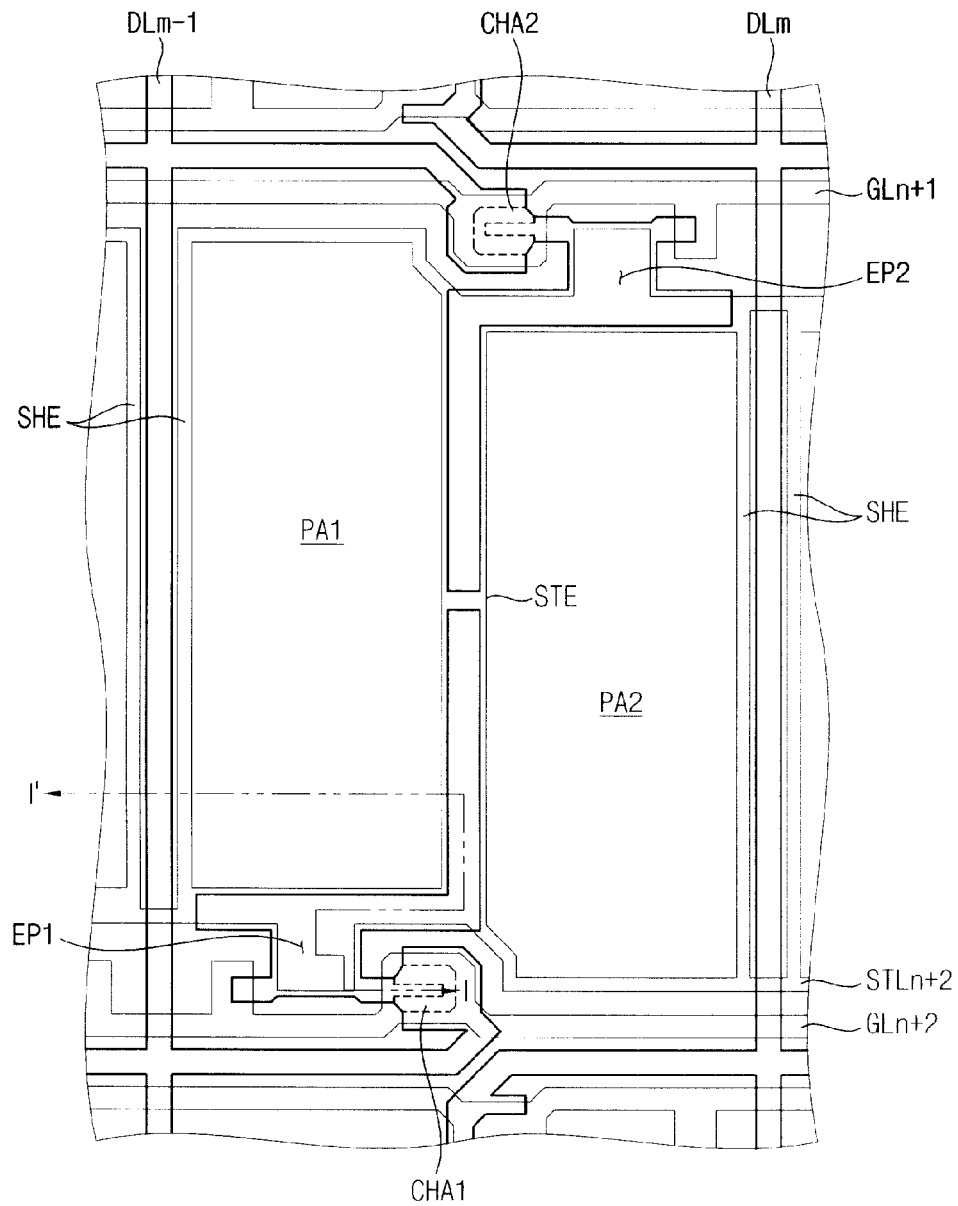
FIGS. 5A and 5C are plan views schematically showing an exemplary embodiment of a method of manufacturing a second conductive pattern of the display substrate of FIG. 3.
Figure 5B:
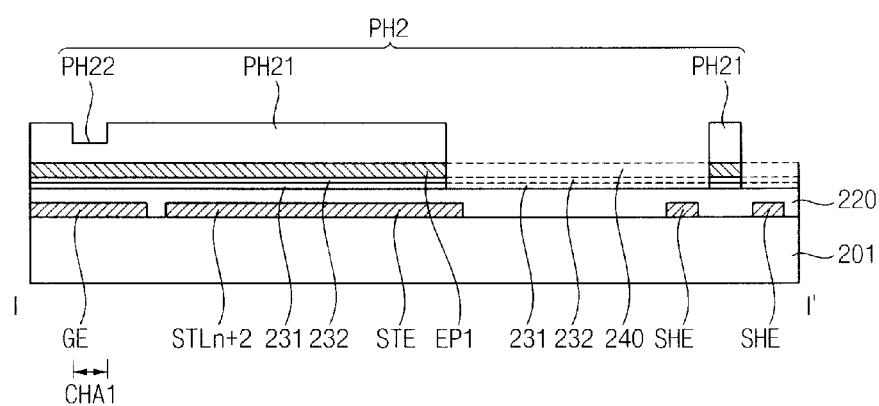
FIGS. 5B and 5D are cross-sectional views schematically showing the method of manufacturing the second conductive pattern of the display substrate of FIG. 3.
Figure 5C:
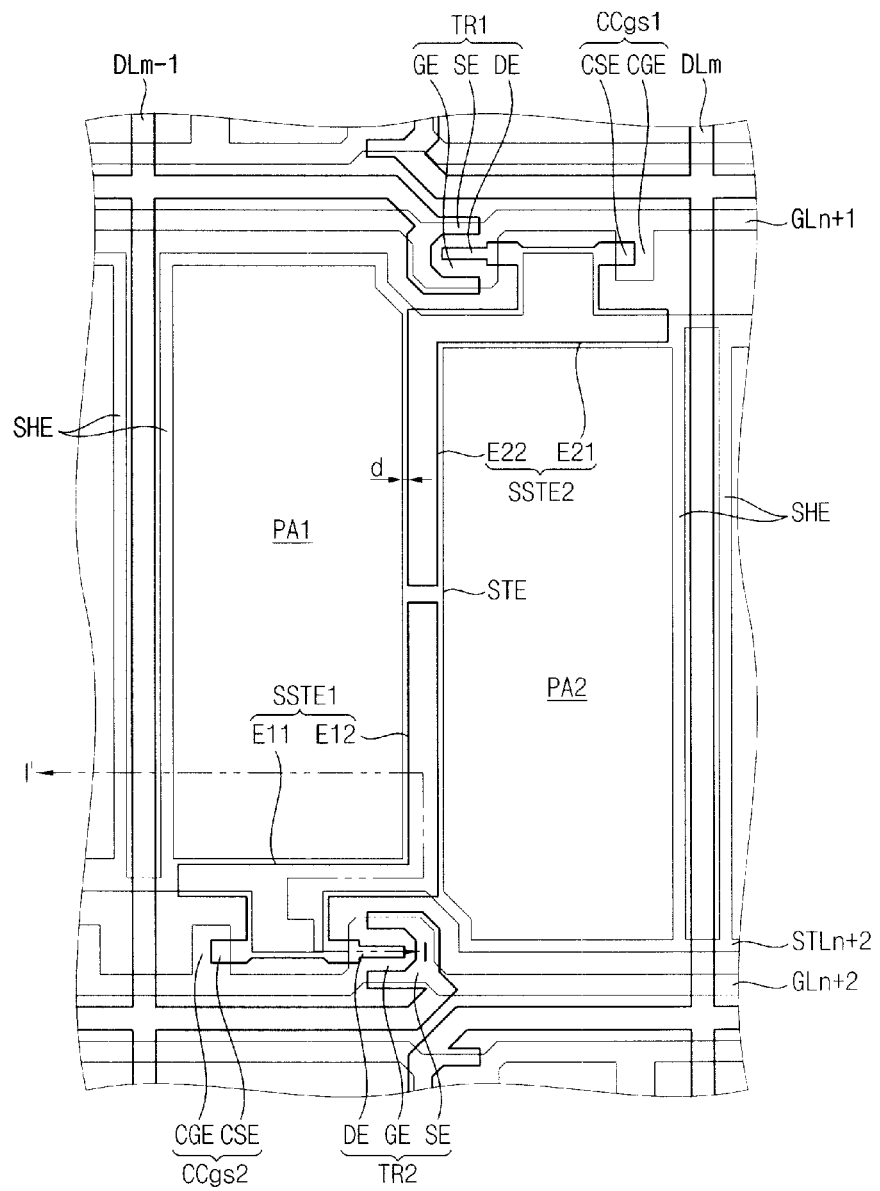
Figure 5D:
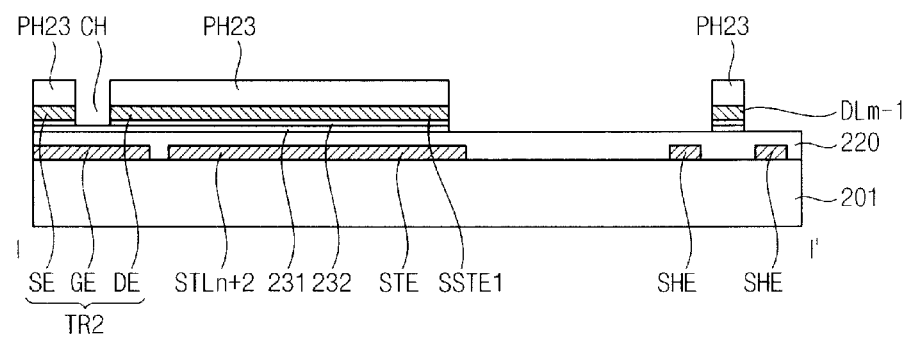

FIGS. 5A and 5C are plan views schematically showing an exemplary embodiment of a method of manufacturing a second conductive pattern of the display substrate of FIG. 3, and FIGS. 5B and 5D are cross-sectional views schematically showing the method of manufacturing the second conductive pattern of the display substrate of FIG. 3.

Referring to FIGS. 5A and 5B, a gate insulation layer 220 is formed to cover the first conductive pattern on the first base substrate 201 on which the first conductive pattern is formed. The gate insulation layer 220 may include an inorganic insulation material. In one exemplary embodiment, for example, the gate insulation layer 220 may include a silicon nitride (SiNx) or a silicon oxide (SiOx), a silicon oxynitride (SiOxNy), although other suitable insulation layers would also be within the scope of these embodiments. A thickness of the gate insulation layer 220 may be varied in accordance with a processing condition. The thickness of the gate insulation layer 220 may be about 4,300 angstroms (Å).

A semiconductor layer 231, an ohmic contact layer 232 and a second conductive layer 240 are formed on the first base substrate 201 on which the gate insulation layer 220 is formed. The second conductive layer 240 may be formed in a single layer or multiple layers. The second conductive layer 240 may include a metal material.

A second photoresist pattern PH2 is formed on the second conductive layer 240. The second photoresist pattern PH2 includes a first photo pattern PH21, and a second photo pattern PH22 having a smaller thickness than the first photo pattern PH21, the thickness taken perpendicular to the first base substrate 201. The first photo pattern PH21 is positioned aligned with an area corresponding to the second conductive pattern, and the second photo pattern PH22 is positioned aligned with channel areas CHA2 and CHA1 respectively corresponding to channels of the first transistor TR1 and the second transistor TR2.

The semiconductor layer 231, the ohmic contact layer 232 and the second conductive layer 240 are simultaneously patterned by using the second photoresist pattern PH2 to form the second conductive pattern, in which the semiconductor layer 231 and the ohmic contact layer 232 are formed below the second conductive pattern, e.g., between the second conductive pattern and the first conductive pattern.

The second conductive pattern includes an (m−1)-th data line DLm−1, an m-th data line DLm, a first electrode pattern EP1 and a second electrode pattern EP2.

The (m−1)-th data line DLm−1 and the m-th data line DLm are longitudinally extended in the second direction D2 and are arranged in the first direction D1. Each of end (e.g., edge) portions of the (m−1)-th data line DLm−1 and the m-th data line DLm is disposed adjacent to and separated from edges of the light-shielding electrode SHE, in the plan view.

The first electrode pattern EP1 is physically and electrically connected to the (m−1)-th data line DLm−1. The first electrode pattern EP1 partially overlaps with the (n+2)-th storage line STLn+2 disposed on the first pixel area PA1 and overlaps with a first area of the storage electrode STE. The first electrode pattern EP1 includes a source electrode SE and a drain electrode DE of the second transistor TR2 shown in FIG. 2, and further includes the compensation source electrode CSE and a first sub-storage electrode SSTE1 of a second compensation capacitor CCgs2.

The second electrode pattern EP2 is physically and electrically connected to the (m−1)-th data line DLm−1. The second electrode pattern EP2 partially overlaps with the (n+1)-th storage line STLn+1 disposed on the second pixel area PA2 and overlaps with a second area of the storage electrode STE. The second electrode pattern EP2 includes a source electrode SE and a drain electrode DE of the first transistor TR1 shown in FIG. 2, and further includes the compensation source electrode CSE and a second sub-storage electrode SSTE2 of a first compensation capacitor CCgs1.

The first electrode pattern EP 1, the second electrode pattern EP1 and the (m−1)-th data line DLm−1 collectively form a single unitary indivisible member.

Referring to FIGS. 5C and 5D, the first and second photo patterns PH21 and PH22 are partially removed to expose the first and second electrode patterns EP1 and EP2 corresponding to the channel areas CHA1 and CHA2, respectively. A third photo pattern PH23 of the remaining material of the first and second photo patterns PH21 and PH22, is formed on an area aligned with the source electrode SE, the drain electrode DE, the compensation source electrode CSE, the first sub-storage electrode SSTE1 and the second sub-storage electrode SSTE2.

The second conductive layer 240 and the ohmic contact layer 232 of the channel areas CH1 and CHA2 are removed by using the third photo pattern PH23 to form each channel CH of the first and second transistors TR1 and TR2. As a result, the first electrode pattern EP1 is patterned to form a source electrode SE and a drain electrode DE of the second transistor TR2, and the compensation source electrode CSE and the first sub-storage electrode SSTE1 of the second compensation capacitor CCgs2. The second electrode pattern EP2 is patterned to form a source electrode SE and a drain electrode DE of the first transistor TR1, and the compensation source electrode CSE and the second sub-storage electrode SSTE2 of the first compensation capacitor CCgs1.

The first sub-storage electrode SSTE1 includes a first electrode E11 partially overlapped with the (n+2)-th storage line STLn+2 and a second electrode E12 connected to the first electrode E11 to be overlapped with a first area of the storage electrode STE. A deviation difference 'd' between an end (e.g., edge) portion of the second electrode E12 and an end (e.g., edge) portion of the storage electrode STE may be no less than about 1.5 μm, so that an overlap margin between the second electrode E12 and the storage electrode STE may be sufficiently secured.

The second sub-storage electrode SSTE2 includes a first electrode E21 partially overlapped with the (n+1)-th storage line STLn+1 and a second electrode E22 connected to the first electrode E21 to be overlapped with a second area of the storage electrode STE. A deviation difference 'd' between an end (e.g., edge) portion of the second electrode E22 and an end (e.g., edge) portion of the storage electrode STE may be no less than about 1.5 μm, so that an overlap margin between the second electrode E22 and the storage electrode STE may be sufficiently secured.

Figure 6A:
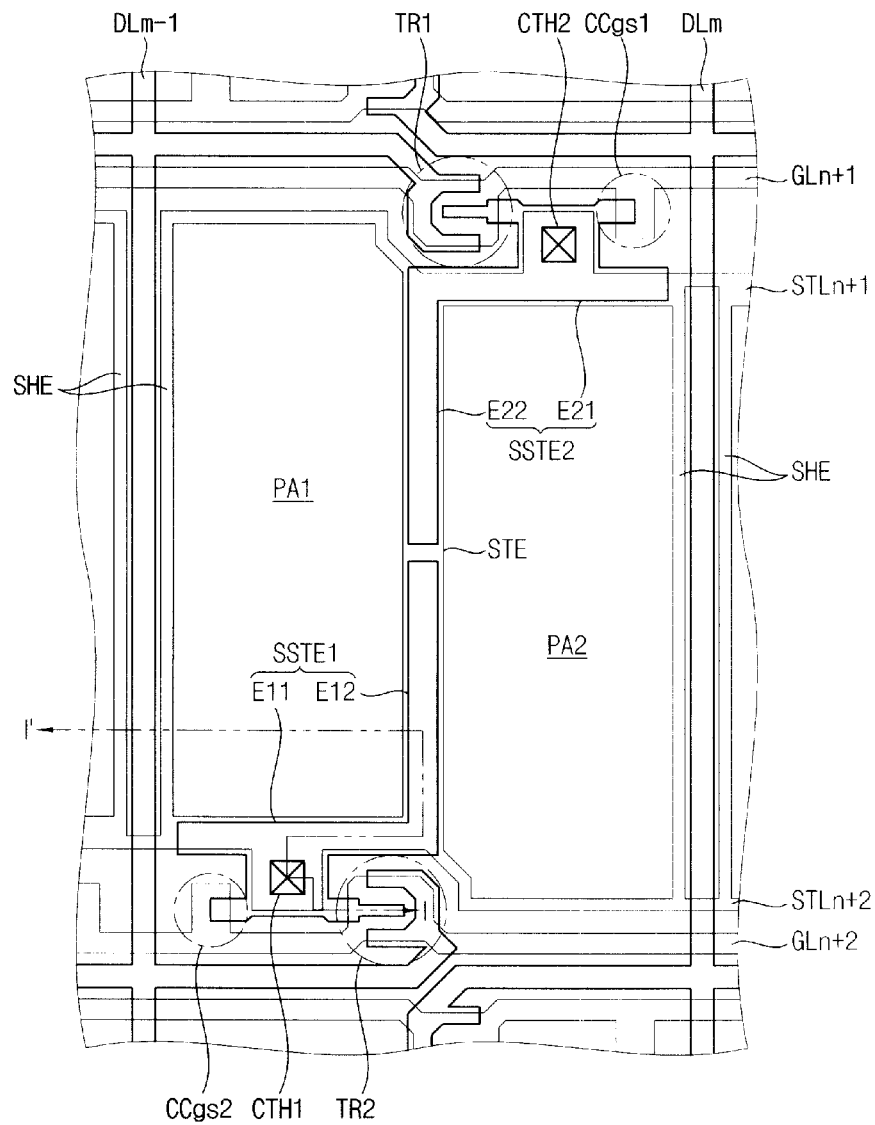
FIG. 6A is a plan view schematically showing an exemplary embodiment of a method of manufacturing a contact portion of the display substrate of FIG. 3.
Figure 6B:
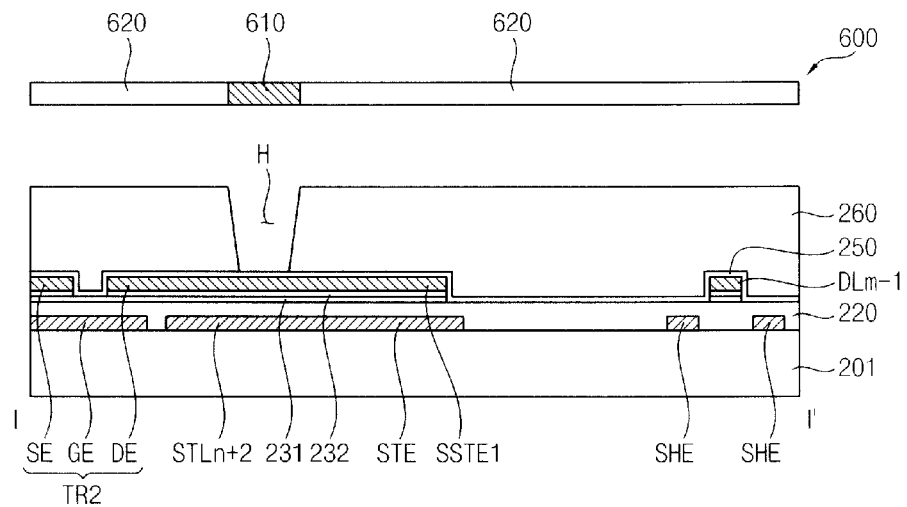
FIGS. 6B and 6C are cross-sectional views schematically showing the method of manufacturing the contact portion of the display substrate of FIG. 3.
Figure 6C:
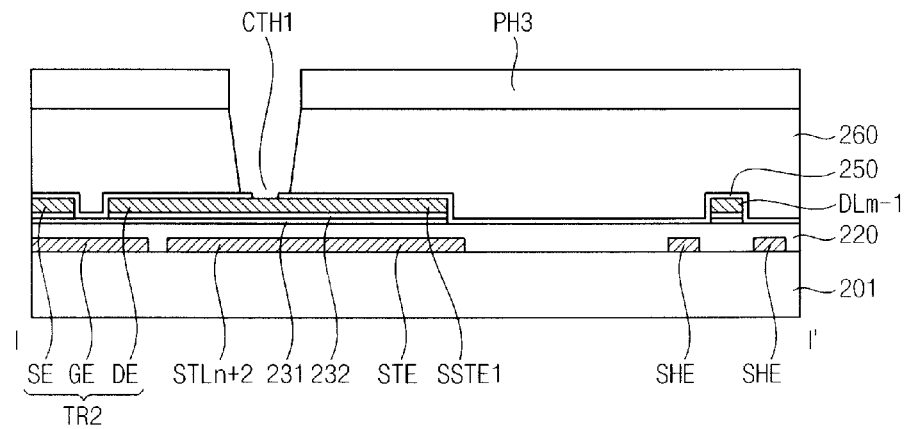

FIG. 6A is a plan view schematically showing an exemplary embodiment of a method of manufacturing a contact portion of the display substrate of FIG. 3, and FIGS. 6B and 6C are cross-sectional views schematically showing the method of manufacturing the contact portion of the display substrate of FIG. 3.

Referring to FIGS. 6A and 6B, a protection insulation layer 250 is formed on the first base substrate 201 on which the second conductive pattern is formed. The protection insulation layer 250 may include an inorganic insulation material. In one exemplary embodiment, for example, the protection insulation layer 250 may include a silicon nitride (SiNx) or a silicon oxide (SiOx), a silicon oxynitride (SiOxNy), although other suitable insulation layers would also be within the scope of these embodiments. A thickness of the protection insulation layer 250 may be varied in accordance with a processing condition. The thickness of the protection insulation layer 250 may be about 2,000 Å.

An organic layer 260 is formed on the first base substrate 201 on which the protection insulation layer 250 is formed. A thickness of the organic layer 260 may be about 2.5 μm to about 3 μm. The organic layer 260 may be a positive type organic layer or a negative type organic layer. Hereinafter, the organic layer 260 is a negative type organic layer.

The organic layer 260 is patterned through a mask 600 including a light-shielding part 610 and a light-transmitting portion 620. The light-shielding part 610 is disposed on an area corresponding to a first contact portion CT1 of the first pixel area PA1, and is disposed on an area corresponding to a second contact portion CT2 of the second pixel area PA2.

The organic layer 260 of an area in which lights are blocked by the light-shielding part 610 is removed through a developing process to form an opening portion H.

Referring to FIGS. 6A and 6C, a third photoresist pattern PH3 is formed on the organic layer 260 through which the opening portion H is formed. The protection insulation layer 250 exposed by the opening portion H is removed by using the third photoresist pattern PH3 to form a first contact hole CTH1 and a second contact hole CTH2. The first sub-storage electrode SSTE1 connected to the drain electrode DE of the second transistor TR2 is exposed through the first contact hole CTH1. The second sub-storage electrode SSTE2 connected to the drain electrode DE of the first transistor TR1 is exposed through the second contact hole CTH2.

Figure 7A:
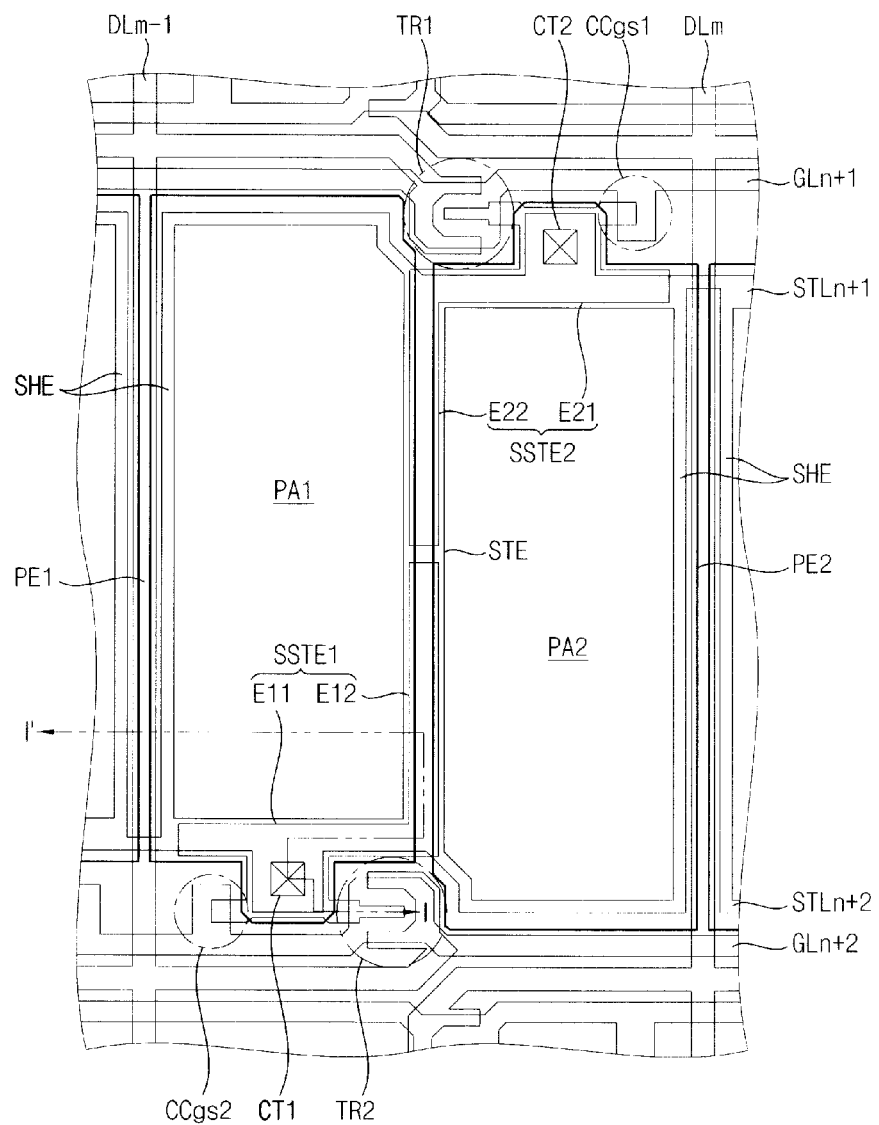
FIG. 7A is a plan view schematically showing an exemplary embodiment of a method of manufacturing a third conductive pattern of the display substrate of FIG. 3.
Figure 7B:
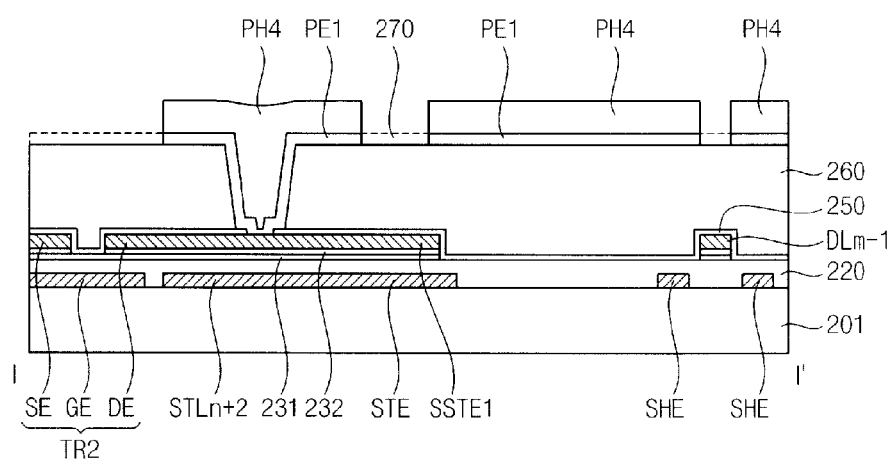
FIG. 7B is a cross-sectional view schematically showing an exemplary embodiment of the method of manufacturing the third conductive pattern of the display substrate of FIG. 3.

FIG. 7A is a plan view schematically showing a method of manufacturing a third conductive pattern of the display substrate of FIG. 3, and FIG. 7B is a cross-sectional view schematically showing the method of manufacturing the third conductive pattern of the display substrate of FIG. 3.

Referring to FIGS. 7A and 7B, an optically transparent and electrically conductive material is formed on the first base substrate 201, through which the first and second contact holes CTH1 and CTH2 are formed, to form a third conductive layer 270. The third conductive layer 270 is patterned by using a fourth photoresist pattern PH4 to form a first pixel electrode PE1 and a second pixel electrode PE2.

The first pixel electrode PE1 is disposed in correspondence with the first pixel area PA1. An end (e.g., edge) portion of the first pixel PE1 is partially overlapped with the (n+1)-th storage line STLn+1, the storage electrode STE, the light-shielding electrode SHE and the (n+2)-th storage line STLn+2. The first pixel electrode PE1 is electrically connected to the first sub-storage electrode SSTE1 through the first contact hole CTH1. A first contact portion CT1 is formed through the first electrode E11 of the first sub-storage electrode SST1.

The second pixel electrode PE2 is disposed in correspondence with the second pixel area PA2. An end (e.g., edge) portion of the second pixel PE2 is partially overlapped with the (n+1)-th storage line STLn+1, the storage electrode STE, the light-shielding electrode SHE and the (n+2)-th storage line STLn+2. The second pixel electrode PE2 is electrically connected to the second sub-storage electrode SSTE2 through the second contact hole CTH2. A first contact portion CT1 is formed through the first electrode E21 of the second sub-storage electrode SST2.

According to the illustrated embodiment, as an organic layer is employed to the display substrate, an interval distance between a data line and a pixel electrode along a vertical direction (e.g., a second direction D2) may be effectively secured. Thus, a coupling capacitance between the data line and pixel electrodes adjacent to the data line may be absolutely decreased. Moreover, as the display panel is driven in a 2×1 dot inversion method, pixel voltages having opposite polarities are applied to the pixel electrodes adjacent to each other along a horizontal direction (e.g., a first direction D1). Thus, a coupling capacitance between adjacent pixel electrodes may be cancelled.

A storage electrode, and a sub-storage electrode overlapped with the storage electrode, are disposed on an area where the data line is not disposed, so that a capacitance of the storage capacitor may be sufficiently secured. Moreover, the sub-storage electrode is overlapped with the storage electrode to have a deviation difference of no less than about 1.5 μm, so that an overlap margin between the sub-electrode and the storage electrode may be sufficiently secured.

According to the illustrated embodiment, a capacitance ("Clc") of a liquid crystal capacitor included in a pixel to which the organic layer is employed, was about 0.780 picofarad (pF), and a capacitance ("Cst") of a storage capacitor included in a pixel to which the sub-storage electrode is employed was about 0.196 pF. Thus, a ratio (Cst/Clc) between the storage capacitance ("Cst") and the liquid crystal capacitance ("Clc") was about 0.25. Moreover, an aperture ratio of the pixel was about 58.7. Therefore, the ratio (Cst/Clc) between the storage capacitance ("Cst") and the liquid crystal capacitance ("Clc") was secured to be no less than about 0.25, so that a delay of a response speed may be reduced or effectively prevented.

As described above, an organic layer is employed to the display device, so that an aperture ratio of the display device may be increased. Moreover, a storage electrode, and a sub-storage electrode overlapped with the storage electrode are formed on an area where a data line is not formed, so that a storage capacitance may be increased. Thus, display quality of the display device may be enhanced.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims.

In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
   a first storage line extended in a first direction on a base substrate;
   a second storage line spaced apart from the first storage line and extended substantially in parallel with the first storage line;
   a first gate line and a second gate line adjacent to the first storage line and the second storage line, respectively, and each extended in the first direction;
   a first data line extended in a second direction crossing the first direction;
   a second data line spaced apart from the first data line and extended substantially in parallel with the first data line;
   a storage electrode extended from the first and second storage lines and in the second direction, and in a same layer as the first and second gate lines, the storage electrode being disposed on an interval area between the first and second data lines;

a first sub-storage electrode overlapped with a first area of the storage electrode; and
a second sub-storage electrode overlapped with a second area of the storage electrode.

2. The display substrate of claim 1, further comprising:
a first pixel electrode electrically connected to the first sub-storage electrode, and disposed on a first pixel area between the first data line and the storage electrode; and
a second pixel electrode electrically connected to the second sub-storage electrode, and disposed on a second pixel area between the storage electrode and the second data line.

3. The display substrate of claim 2, further comprising:
an organic layer disposed between the first sub-storage electrode and the first pixel electrode, and between the second sub-storage electrode and the second pixel electrode.

4. The display substrate of claim 2, wherein
the first sub-storage electrode comprises:
a first electrode disposed overlapping the second storage line overlapped with the first pixel electrode; and
a second electrode overlapped with the first area of the storage electrode, and the second sub-storage electrode comprises:
a first electrode disposed overlapping the first storage line overlapped with the second pixel electrode; and
a second electrode overlapped with the second area of the storage electrode.

5. The display substrate of claim 2, further comprising:
a first transistor connected to the second gate line, the first data line and the first pixel electrode; and
a second transistor connected to the first gate line, the first data line and the second pixel electrode.

6. The display substrate of claim 5, further comprising:
a first compensation capacitor disposed adjacent to the first transistor and compensating a parasitic capacitance of the first transistor; and
a second compensation capacitor disposed adjacent to the second transistor and compensating a parasitic capacitance of the second transistor.

7. The display substrate of claim 1, further comprising a light-shielding electrode extended in the second direction and disposed adjacent to an edge portion of the first data line or an edge portion of the second data line.

8. The display substrate of claim 7, wherein the light-shielding electrode is connected to the first and second storage lines.

9. A method of manufacturing a display substrate, the method comprising:
forming in a same first layer, a first storage line extended in a first direction, a second storage line spaced apart from the first storage line and extended substantially in parallel with the first storage line, a storage electrode extended from the first and second storage lines and in a second direction crossing the first direction, a first gate line extended in the first direction and adjacent to the first storage line, and a second gate line parallel with the first gate line and adjacent to the second storage line, on a base substrate;
forming in a same second layer, a first data line extended in the second direction, a second data line spaced apart from the first data line and extended substantially in parallel with the first data line, a first sub-storage electrode overlapped with a first area of the storage electrode, and a second sub-storage electrode overlapped with a second area of the storage electrode; and
forming in a same third layer, a first pixel electrode electrically connected to the first sub-storage electrode, and a second pixel electrode electrically connected to the second sub-storage electrode, on an interval area between the first and second data lines.

10. The method of claim 9, further comprising:
forming an organic layer between the first pixel electrode and the first sub-storage electrode, and between the second pixel electrode and the second sub-storage electrode.

11. The method of claim 9, wherein
the first sub-storage electrode comprises:
a first electrode disposed overlapping the second storage line overlapped with the first pixel electrode; and
a second electrode overlapped with the first area of the storage electrode, and the second sub-storage electrode comprises:
a first electrode disposed overlapping the first storage line overlapped with the second pixel electrode; and
a second electrode overlapped with the second area of the storage electrode.

12. The method of claim 11, further comprising:
forming a first transistor connected to the second gate line, the first data line and the first pixel electrode, and a second transistor connected to the first gate line, the first data line and the second pixel electrode.

13. The method of claim 12, further comprising:
forming a first compensation capacitor on an area adjacent to the first transistor, and a second compensation capacitor on an area adjacent to the second transistor.

14. The method of claim 11, wherein forming the storage electrode further comprises:
forming a light-shielding electrode on an area adjacent to an edge portion of the first data line, or an edge portion of the second data line, the light-shielding electrode being extended in the second direction.

15. The method of claim 14, wherein the light-shielding electrode is connected to the first and second storage lines.

16. A display device comprising:
a display panel comprising:
a first storage line extended in a first direction;
a second storage line spaced apart from the first storage line and extended substantially in parallel with the first storage line;
a first gate line and a second gate line adjacent to the first storage line and the second storage line, respectively, and each extended in the first direction;
a first data line extended in a second direction crossing the first direction;
a second data line spaced apart from the first data line and extended substantially in parallel with the first data line;
a storage electrode extended from the first and second storage lines and in the second direction, and in a same layer as the first and second gate lines, the storage electrode disposed on an interval area between the first and second data lines;
a first sub-storage electrode overlapped with a first area of the storage electrode; and
a second sub-storage electrode overlapped with a second area of the storage electrode; and
a panel driving part applying data signals having polarities different from each other to the first data line and the second data line, during one frame.

17. The display device of claim 16, wherein the display panel further comprises:

a first pixel electrode electrically connected to the first sub-storage electrode through a first hole disposed through an organic layer, the first pixel electrode disposed on a first pixel area between the first data line and the storage electrode; and a second pixel electrode electrically connected to the second sub-storage electrode through a second hole disposed through the organic layer, the second pixel electrode being disposed on a second pixel area between the storage electrode and the second data line.

18. The display device of claim 17, wherein the first sub-storage electrode comprises:

a first electrode disposed overlapping the second storage line overlapped with the first pixel electrode; and a second electrode overlapped with the first area of the storage electrode, and the second sub-storage electrode comprises:

a first electrode disposed overlapping the first storage line overlapped with the second pixel electrode; and a second electrode overlapped with the second area of the storage electrode.

19. The display device of claim 17, wherein the display panel further comprises a light-shielding electrode extended in the second direction and disposed adjacent to an edge portion of the first data line, or an edge portion of the second data line.

* * * * *